United States Patent
Ohya

(10) Patent No.: US 7,737,431 B2
(45) Date of Patent: Jun. 15, 2010

(54) GROUP III NITRIDE COMPOUND SEMICONDUCTOR LIGHT-EMITTING DEVICE

(75) Inventor: Masaki Ohya, Tokyo (JP)

(73) Assignee: NEC Corporation, Tokyo (JP)

( * ) Notice: Subject to any disclaimer, the term of this patent is extended or adjusted under 35 U.S.C. 154(b) by 633 days.

(21) Appl. No.: 11/572,306

(22) PCT Filed: Jul. 14, 2006

(86) PCT No.: PCT/JP2006/314045

§ 371 (c)(1),
(2), (4) Date: Jan. 18, 2007

(87) PCT Pub. No.: WO2007/037057

PCT Pub. Date: Apr. 5, 2007

(65) Prior Publication Data

US 2008/0303017 A1 Dec. 11, 2008

(30) Foreign Application Priority Data

Sep. 28, 2005 (JP) ............................. 2005-281132

(51) Int. Cl.
*H01L 31/00* (2006.01)

(52) U.S. Cl. .................. 257/13; 257/14; 257/E25.019; 372/46.01

(58) Field of Classification Search .................. 372/45, 372/46; 438/689; 257/184
See application file for complete search history.

(56) References Cited

U.S. PATENT DOCUMENTS

2002/0105986 A1* 8/2002 Yamasaki ..................... 372/45
2005/0074973 A1* 4/2005 Ouchi et al. ................. 438/689

FOREIGN PATENT DOCUMENTS

| JP | 2000-223786 A | 8/2000 |
| JP | 2002-190635 A | 7/2002 |
| JP | 2003-078215 A | 3/2003 |
| JP | 2003-115641 A | 4/2003 |
| JP | 2005-019835 A | 1/2005 |

* cited by examiner

*Primary Examiner*—Jerome Jackson, Jr.
*Assistant Examiner*—Dale Page
(74) *Attorney, Agent, or Firm*—Sughrue Mion, PLLC

(57) ABSTRACT

A group III nitride compound semiconductor light-emitting device according to the present invention includes: an active layer (105) comprised of a group III nitride compound semiconductor; a current blocking layer (108) which is formed on the active layer (105) and has a striped aperture (108*a*); a superlattice layer (p-type layer 109) which buries the aperture (108*a*) and is comprised of a group III nitride compound semiconductor including Al; and a cladding layer (110) which is formed on the superlattice layer and is comprised of a group III nitride compound semiconductor including Al. When an average Al composition ratio of the superlattice layer is represented as x1 and an average Al composition ratio of the cladding layer (110) is represented as x2, it is represented as x1<x2.

7 Claims, 5 Drawing Sheets

GROUP III NITRIDE COMPOUND SEMICONDUCTOR LIGHT-EMITTING DEVICE

This application claims priority from PCT Application No. PCT/JP2006/314045 filed Jul. 14, 2006, and from Japanese Patent Application No. 2005-281132 filed Sep. 28, 2005, which applications are incorporated herein by reference.

TECHNICAL FIELD

The present invention relates to a group III nitride compound semiconductor light-emitting device having a current blocking layer.

BACKGROUND ART

A digital versatile disk (referred to as DVD) that is a typical optical disk in recent years is in widespread use in very wide range of fields, from readout systems such as movies, music, games, and car navigation to recording systems such as TV recorders and personal computer mounting drives. Recording capacity thereof is approximately seven times as much as CD, for example, it is sufficient capacity for recording the current TV video in standard image quality. However, when digital hi-vision video to be expected to become widespread in future is directly recorded in high quality, amount of information overwhelmingly increases as compared before; and therefore, the current DVD can only record approximately 20 to 30 minutes. Consequently, a next generation optical disk system which is capable of recording large capacity as much nearly 5 times as conventional DVDs is becoming increasingly expected.

As a light source for use in a next generation optical disk system, a nitride based blue-violet semiconductor laser with a wavelength of 405 nm is used. This is because light can be narrowed down as compared with an AlGaInP based red semiconductor laser with a wavelength of 650 nm used in conventional DVDs and is suitable for high density recording of signals.

An existing nitride based semiconductor laser is not easy for manufacturing due to a material inherent property and it is the common practice to have a ridge structure by dry etching a p-type cladding layer. More specifically, as shown in FIG. 4, an n-type substrate 11, an n-type cladding layer 13, an active layer 15, and a p-type cladding layer 20 which is of a ridge structure are accumulated in this order. Further, the lower surface of the n-type substrate 11 and the upper surface of a ridge portion of the p-type cladding layer 20 are provided with electrodes 22 and 23, respectively. In the case of the nitride based semiconductor laser having the ridge structure, horizontal optical confinement is controlled by refractive-index difference with outside air of the ridge structure. Therefore, the post-etching remaining thickness d of the p-type cladding layer 20 is important parameters for deciding beam shapes.

However, there arise problems as follows. First, since outside the ridge is air with small refractive indexes, a horizontal refractive-index difference $\Delta n$ comparatively increases. Therefore, it tends to generate a higher transverse mode and it is difficult to perform single transverse mode operation with a high output. The remaining thickness d of the p-type cladding layer 20 needs to be increased in order to reduce $\Delta n$ in the nitride based semiconductor laser with the ridge structure. In this case, since horizontal current broadening in the p-type cladding layer 20 increases; ineffective current components which do not contribute to laser oscillation are increased to cause increase of operation current.

Furthermore, since outside the ridge structure is air which is low in thermal conductivity, most heat radiation from an emitting region is performed only from the n side. Therefore, the nitride based semiconductor laser having the ridge structure is low in radiation performance and difficult in high output and operation in high temperature.

Further, a ridge waveguide is formed by processing the p-type cladding layer 20 with a method such as dry etching. Therefore, it tends to generate variation in the remaining thickness d of the p-type cladding layer 20 which is extremely important for control of a beam shape; and this is one of factors which make yield low.

In order to solve these problems, there is proposed a nitride based semiconductor laser having an inner stripe structure, disclosed in Patent Document 1, for example. As shown in FIG. 5, in the case of this structure, since outside the stripe is covered with a nitride based material, horizontal refractive-index difference $\Delta n$ is relatively low. Therefore, single transverse mode operation with a high output can be easily realized.

Furthermore, outside the stripe is covered with a nitride based material having high coefficient of thermal conductivity, and therefore, radiation performance is high and high output and operation in high temperature can be made.

Further, since the portion d corresponding to the remaining thickness in the p-type cladding layer of the ridge structure is formed in crystal growth, variation in layer thickness is small and a beam shape can be stably controlled. Therefore, it is a high yield and superior in mass productivity.

Additionally, since an area in contact with a p-electrode can be widely taken, contact resistance can be reduced as compared with the ridge structure as shown in FIG. 4.

[Patent Document 1] Japanese Laid-open Patent Publication No. 2003-78215

DISCLOSURE OF THE INVENTION

However, the prior art disclosed in above mentioned document has room for improvement in the following point.

First, in the case of the nitride based semiconductor laser having the inner stripe structure disclosed in the Patent Document 1, it has not always been easy to stably obtain low device resistance. The reason can be explained as follows.

In order to form the inner stripe structure as shown in FIG. 5, crystal growth is performed on the convex and concave surface of a current blocking layer 18 having a striped aperture using Mg as a dopant to form a p-type cladding layer 20. At this time, Mg incorporation efficiencies at the central portion and the end are different in the portion of the p-type cladding layer 20 buried in the aperture and therefore in-plane uniformity of Mg is not necessarily maintained. As a result, it has not always been easy to stably realize low device resistance.

The present inventor has found out that a layer (referred to as a superlattice layer below) having a superlattice structure in the aperture of the current blocking layer needs to be formed in order to stably realize such a low device resistance. However, as described, since the superlattice layer is formed by crystal growth to the aperture of the current blocking layer, there is a case that variation in the superlattice structure becomes remarkable. Therefore, resistance at a portion where the layer thickness is thick increases and low device resistance cannot be still realized stably. As described, a group III nitride compound semiconductor light-emitting device capable of stably obtaining low device resistance has been required.

According to the present invention, there is provided a group III nitride compound semiconductor light-emitting device, including:

an active layer made of a group III nitride compound semiconductor; a current blocking layer which is formed on the active layer and has a striped aperture;

a superlattice layer which buries the aperture and contains a group III nitride compound semiconductor including Al; and a cladding layer which is formed on the superlattice layer and is made of a group III nitride compound semiconductor including Al, wherein, when an average Al composition ratio of the superlattice layer is represented as x1 and an average Al composition ratio of the cladding layer is represented as x2, it is represented as x1<x2.

According to the present invention, an average Al composition ratio of the superlattice layer, which buries the aperture of the current blocking layer and contains a group III nitride compound semiconductor, is smaller than an average Al composition ratio of the cladding layer, which is formed on the superlattice layer. Therefore, there can be provided a group III nitride compound semiconductor light-emitting device which is capable of stably obtaining low device resistance.

In addition, the superlattice layer means a layer having the superlattice structure.

According to the present invention, there can be provided a group III nitride compound semiconductor light-emitting device which is capable of stably obtaining low device resistance.

BRIEF DESCRIPTION OF THE DRAWINGS

The above mentioned object and other object, and features and advantages will become further apparent from the following described preferred embodiments and the following accompanying drawings.

BEST MODE FOR CARRYING OUT THE INVENTION

Figure 1:
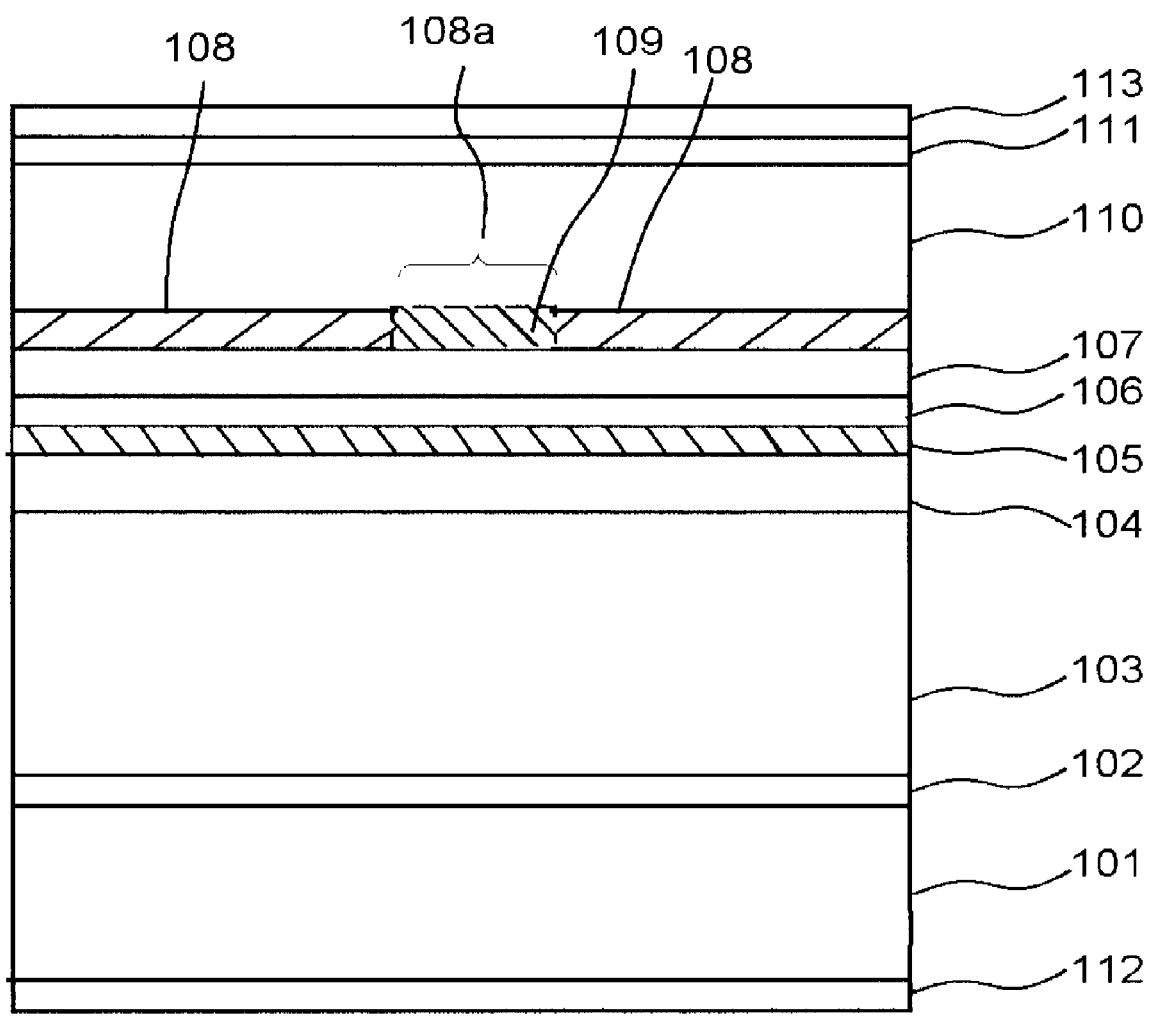
FIG. 1 is a schematic cross-sectional view of a group III nitride compound semiconductor light-emitting device according to a first embodiment.

Embodiments according to the present invention will be described below using the drawings. In addition, in all the drawings, the same reference numerals are given to similar constitutional elements and their description will not be repeated.

First Embodiment

FIG. 1 is a cross-sectional view of a group III nitride compound semiconductor light-emitting device according to a first embodiment. In the group III nitride compound semiconductor light-emitting device, an n-type buffer layer 102, an n-type cladding layer 103, an n-type optical confinement layer 104, an active layer 105, a p-type cap layer 106, and a p-type optical confinement layer 107 are stacked on an n-type substrate 101 in this order.

A current blocking layer 108 having a striped aperture 108a is formed on the p-type optical confinement layer 107. Further, a p-type layer 109 which is a superlattice layer is formed so as to bury the aperture 108a of the current blocking layer 108. A p-type cladding layer 110 and a p-type contact layer 111 are stacked on the current blocking layer 108 and the p-type layer 109. An n-electrode 112 is provided on the undersurface of the n-type substrate 101 and a p-electrode 113 is provided on the upper surface of the p-type contact layer 111.

The n-type substrate 101 includes a GaN substrate, for example. The n-type buffer layer 102 contains GaN, for example, and is approximately 1 μm thick. The n-type cladding layer 103 contains $Al_{0.1}Ga_{0.9}N$, for example, and is approximately 2 μm thick. The n-type optical confinement layer 104 contains GaN, for example. The active layer 105 has a multiquantum well structure composed of a well layer and a barrier layer. The well layer contains $In_{0.15}Ga_{0.85}N$, for example, and is approximately 3 nm thick. The barrier layer contains $In_{0.01}Ga_{0.99}N$, for example, and is approximately 4 nm thick. The p-type cap layer 106 contains $Al_{0.2}Ga_{0.8}N$, for example. The p-type optical confinement layer 107 contains GaN, for example, and is approximately 0.1 μm thick. The p-type contact layer 111 contains GaN, for example, and is approximately 0.1 μm thick. The n-type dopant is Si, for example, and the p-type dopant is Mg, for example.

The current blocking layer 108 contains $Al_wGa_{1-w}N$ ($0.4 \leq w \leq 1$), and contains AlN, for example. The current blocking layer 108 containing a nitride based material with high thermal conductivity is formed on the outside of the aperture 108a and therefore there can be provided a group III nitride compound semiconductor light-emitting device which is high radiation performance and is superior in high output characteristics, and operating characteristics in high temperature. The layer thickness of the current blocking layer 108 can be preferably equal to or less than 0.2 μm, more preferably equal to or less than 0.12 μm. In the present embodiment, it is approximately 0.1 μm, for example.

A distance between the active layer 105 and the current blocking layer 108 is preferably equal to or less than 0.2 μm, more preferably equal to or less than 0.15 μm. In the present embodiment, it is approximately 0.1 μm.

The p-type layer 109 has a superlattice structure composed of approximately 2.5 nm thick GaN and approximately 2.5 nm thick $Al_{0.1}Ga_{0.9}N$.

Furthermore, in the present embodiment, when an average Al composition ratio of the p-type layer 109 having the superlattice structure is represented as "x1" and an average Al composition ratio of the p-type cladding layer 110 is represented as "x2," it can be represented as x1<x2. More specifically, when the p-type layer 109 has the superlattice structure composed of 2.5 nm thick GaN and 2.5 nm thick $Al_{0.1}Ga_{0.9}N$, the p-type cladding layer 110 can be of a superlattice structure composed of 2.5 nm thick GaN and 2.5 nm thick $Al_{0.2}Ga_{0.8}N$, for example. Furthermore, for example, when the p-type layer 109 has a superlattice structure composed of 5 nm thick GaN and 2.5 nm thick $Al_{0.15}Ga_{0.85}N$, the p-type cladding layer 110 can be of the superlattice structure composed of 2.5 nm thick GaN and 2.5 nm thick $Al_{0.2}Ga_{0.8}N$, for example.

Such group III nitride compound semiconductor light-emitting device can be suitably used for a blue-violet semiconductor laser.

Next, a manufacturing method according to the first embodiment will be described.

A 300 hPa low-pressure MOVPE growth system can be used for manufacturing the group III nitride compound semiconductor light-emitting device according to the present embodiment. Mixed gas of hydrogen and nitrogen can be used for carrier gas, and trimethylgallium, trimethylaluminum, and trimethylindium can be used as Ga, Al, and In sources, respectively. Furthermore, silane can be used as the n-type dopant, and bis-cyclopentadienyl magnesium can be used as the p-type dopant.

First, after an n-type GaN substrate 101 is put in a growth system, temperature of the substrate is risen while feeding ammonia, and growth is started at a time when the temperature reach growth temperature. In a first growth, an n-type GaN buffer layer 102, an n-type $Al_{0.1}Ga_{0.9}N$ cladding layer 103, an n-type GaN optical confinement layer 104, an active layer 105 having a multiquantum well structure composed of an $In_{0.15}Ga_{0.85}N$ well layer and an $In_{0.01}Ga_{0.99}N$ barrier layer, a p-type $Al_{0.2}Ga_{0.8}N$ cap layer 106, a p-type GaN optical confinement layer 107, and a current blocking layer 108 are formed. The growth temperature can be set to, for example, 200 to 700° C. at the current blocking layer 108, 800° C. at the active layer 105, and 1100° C. at other than those.

The current blocking layer 108 is AlN, for example, and the layer thickness thereof is set to 0.1 µm. Since the AlN current blocking layer 108 grows at low temperature, it becomes an amorphous state at the completion of the first growth. A $SiO_2$ film is deposited thereon and a $SiO_2$ mask having a striped aperture is formed using usual photolithography technology. Next, mixed liquid of phosphoric acid and sulfuric acid is maintained at 50 to 200° C. to serve as etchant and a striped aperture is formed in the AlN current blocking layer 108.

Next, after putting in the growth system again, the temperature of the substrate is risen while feeding ammonia, and a second growth is started at a time when the temperature reaches the growth temperature. At this time, in the AlN current blocking layer 108 with a thickness of 0.1 µm, crystallization is developed during a heating process of the substrate.

After that, a p-type layer 109 having a superlattice structure, a p-type cladding layer 110, and a p-type GaN contact layer 111 are formed. The p-type layer 109 having the superlattice structure is of a superlattice structure composed of 2.5 nm thick GaN and 2.5 nm thick $Al_{0.1}Ga_{0.9}N$, for example. The p-type cladding layer 110 is of a superlattice structure composed of 2.5 nm thick GaN and 2.5 nm thick $Al_{0.2}Ga_{0.8}N$, for example. After that, an n-electrode 112 is formed on the undersurface and a p-electrode 113 is formed on the upper surface.

In the present embodiment, the group III nitride compound semiconductor light-emitting device can be manufactured by such simple method and therefore it is superior in mass productivity.

Effects according to the first embodiment will be described below.

In the present embodiment, the average Al composition ratio of the p-type layer 109 having the superlattice structure is smaller than the average Al composition ratio of the p-type cladding layer 110.

As described, the average Al composition ratio of the p-type layer 109 which is the superlattice layer provided inside the striped aperture 108a is reduced, thereby reducing effects on resistance deterioration due to nonuniformity of the superlattice structure, whereby low device resistance can be stably obtained.

Reasons that such effects can be obtained will be described below.

When a superlattice layer of GaN/AlGaN, for example, is formed inside the striped aperture formed in the current blocking layer, a carrier is induced at each interface in the superlattice structure. And therefore, carrier mobility in an in-plane direction increases as compared with a bulk structure. Therefore carrier distribution in the aperture becomes uniform regardless of right and wrong of in-plane uniformity of Mg distribution in the aperture. As a result, low device resistance can be stably obtained.

However, since the superlattice layer is formed by crystal growth inward the striped aperture 108a of the current blocking layer 108, there is possibility that variation in layer thickness in the superlattice structure becomes remarkable. In this case, for example, when the superlattice layer contains GaN/AlGaN and the layer thickness of each layer is varied, although effect of homogenization of the carrier distribution owing to the superlattice structure is not lost, resistance becomes high at a portion where the layer thickness of the AlGaN layer is thick and consequently low device resistance cannot be stably obtained.

In order to reduce this effect, it is considerable to reduce Al composition of AlGaN which forms the superlattice layer. However, the cladding layer (p-type cladding layer 110) on the near side to the current blocking layer 108 is a main layer which controls vertical optical distribution and therefore lower limit in its Al composition ratio is determined from a view point of the optical distribution control. Consequently, in the present embodiment, the average Al composition ratio of the p-type cladding layer 110 on the near side to the current blocking layer 108 is determined from the view point of the optical distribution control, and with respect to that, the average Al composition ratio of the superlattice structure provided in the striped aperture 108a is set to be low from a view point of device resistance. This makes possible to reduce effects on resistance deterioration due to nonuniformity of the superlattice structure while maintaining optical confinement effect even when the superlattice structure is nonuniform. As a result, in the group III nitride compound semiconductor light-emitting device, low device resistance can be stably obtained.

Furthermore, in the present embodiment, the layer thickness of the current blocking layer can be preferably equal to or less than 0.2 µm, more preferably equal to or less than 0.12 µm.

The layer thickness of the current blocking layer is set within the above mentioned range, thereby suppressing variation itself of the superlattice structure formed inside the striped aperture.

More specifically, in the case of providing the AlN current blocking layer on the GaN layer, for example, the current blocking layer is formed at low temperature so as to be an amorphous state in order to prevent from generating crack caused by difference between the both lattice constants. In the current blocking layer of this amorphous state, crystallization is accelerated at a heating process of a second crystal growth, and at this time, if the current blocking layer is too thick, the second crystal growth starts before the crystallization of the current blocking layer sufficiently proceeds. Crystal growth rate is low at the above of the current blocking layer because crystallinity is low above thereof and much raw gas is supplied to the striped aperture, and therefore, it causes to generate nonuniformity of the superlattice structure provided inside the striped aperture. In order to suppress the nonuniformity of the superlattice structure, the thickness of the current blocking layer needs to be thinner than an upper limit value in which the current blocking layer is sufficiently single crystallized at the heating process of the second crystal growth.

In the present embodiment, the thickness of the current blocking layer is set to the above mentioned range, thereby suppressing the nonuniformity of the superlattice structure formed inside the striped aperture. As a result, low device resistance can be further stably obtained.

In the present embodiment, the current blocking layer can be made of $Al_wGa_{1-w}N$ ($0.4 \leq w \leq 1$).

This makes possible to sufficiently obtain current constriction function even when the thickness of the current blocking layer is thin. In more detail, if an energy barrier with respect to the carrier of the current blocking layer becomes small, a current component which does not contribute to laser oscillation exponentially increases and operation current rapidly deteriorates. The thinner the current blocking layer is, the more remarkable the tendency is. In order to suppress the effect, the energy barrier of the current blocking layer is set to be larger than a lower limit value in which the current component which does not contribute to laser oscillation begins to rapidly increase, and when the current blocking layer contains AlGaN, Al composition is set to be higher. More specifically, even when the thickness of the current blocking layer is thin, equal to or less than 0.12 μm, sufficient current constriction function can be realized by setting the Al composition of the current blocking layer to be 0.4 or more and 1 or less.

In the present embodiment, a separation distance between the current blocking layer and the active layer can be preferably equal to or less than 0.2 μm, more preferably equal to or less than 0.15 μm.

The separation distance between the current blocking layer and the active layer is set to be the above mentioned range, thereby considerably reducing ineffective current which flows in a horizontal direction therebetween, whereby low operation current can be realized.

Generally, if the current blocking layer approximates to the active layer, horizontal refractive-index difference Δn increases and consequently it becomes difficult to perform single transverse mode operation with high output. In this case, if the thickness and material of the current blocking layer are specified as described above, the horizontal refractive-index difference Δn can be maintained to be sufficiently small value, for example, approximately 0.005 even when the distance between the current blocking layer and the active layer approximates to the above mentioned range. Therefore, operation current can be considerably reduced, while maintaining the single transverse mode operation with high output.

Second Embodiment

Figure 2:
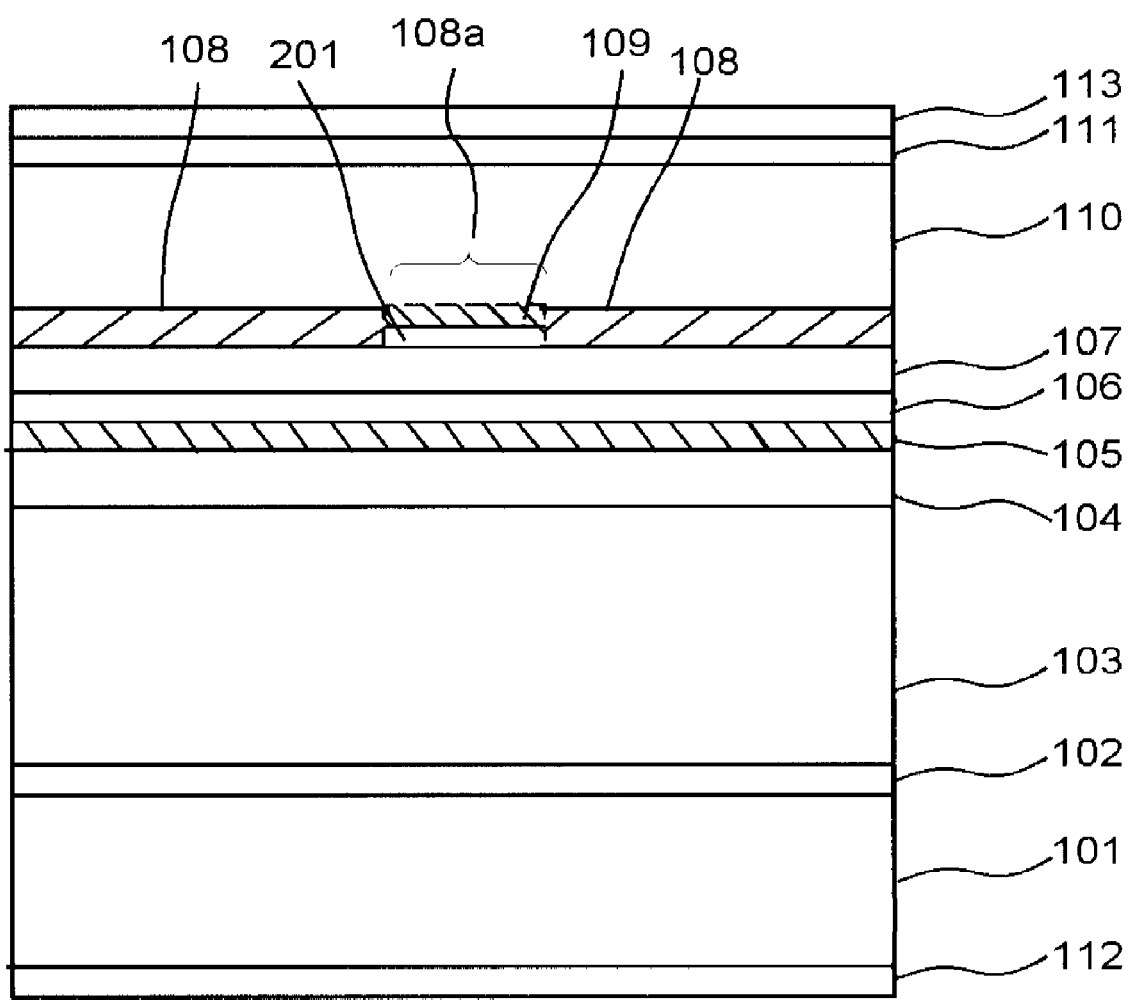
FIG. 2 is a schematic cross-sectional view of a group III nitride compound semiconductor light-emitting device according to a second embodiment.

FIG. 2 is a cross-sectional view according to a second embodiment.

A different point from the first embodiment is that a p-type regrowth layer 201 and a p-type layer 109 having a superlattice structure are included in a striped aperture 108a of a current blocking layer 108. In this case, the p-type regrowth layer 201 contains GaN, AlGaN, InGaN, or the like.

The second embodiment can also obtain the same effects as the first embodiment and further obtain an effect which improves flatness of a regrowth interface, an effect which adjusts vertical optical distribution, and the like. Furthermore, also in the second embodiment, the p-type layer 109 has the superlattice structure. Therefore, even it is a structure which includes layers other than the p-type layer 109 having the superlattice structure in the striped aperture 108a of the current blocking layer 108, the effect of homogenization of the carrier distribution in the striped aperture 108a of the current blocking layer 108 can be obtained as in the first embodiment.

In addition, the above mentioned embodiment is an exemplification, various modifications can be made, and a person skilled in the art will recognize that such modifications are also within the scope of the present invention. For example, not only the p-type regrowth layer 201 but also layers other than that may be included in the striped aperture 108a of the current blocking layer 108 as layers other than the p-type layer 109 having the superlattice structure.

Third Embodiment

Figure 3:
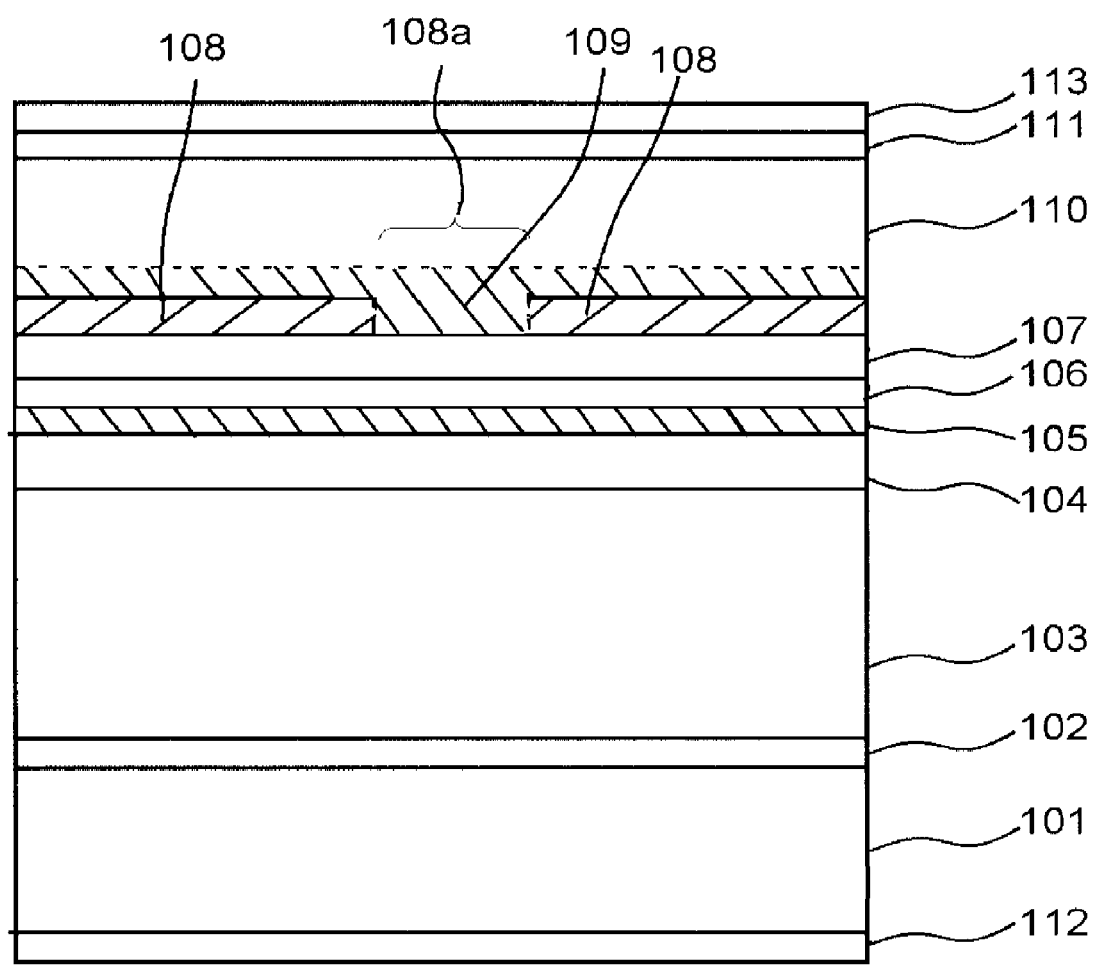
FIG. 3 is a schematic cross-sectional view of a group III nitride compound semiconductor light-emitting device according to a third embodiment.
Figure 4:
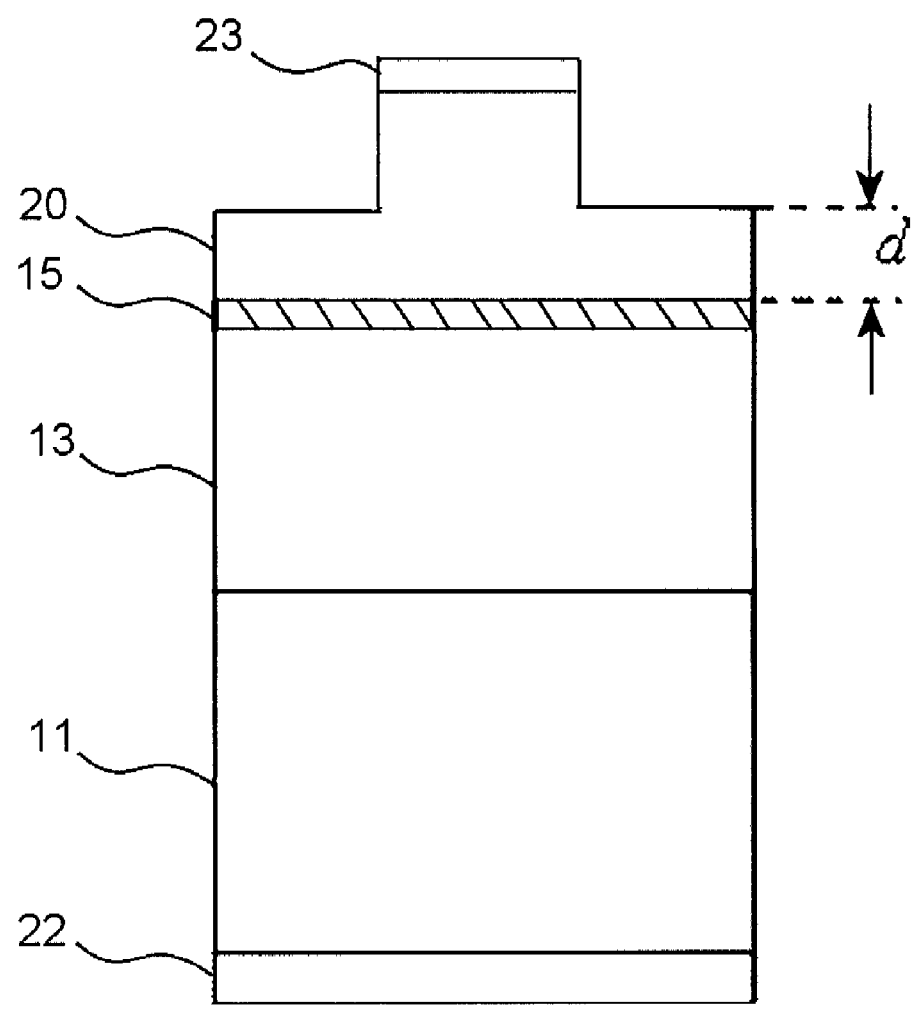
FIG. 4 is a typically shown cross-sectional view of a nitride based semiconductor laser having a conventional ridge structure.
Figure 5:
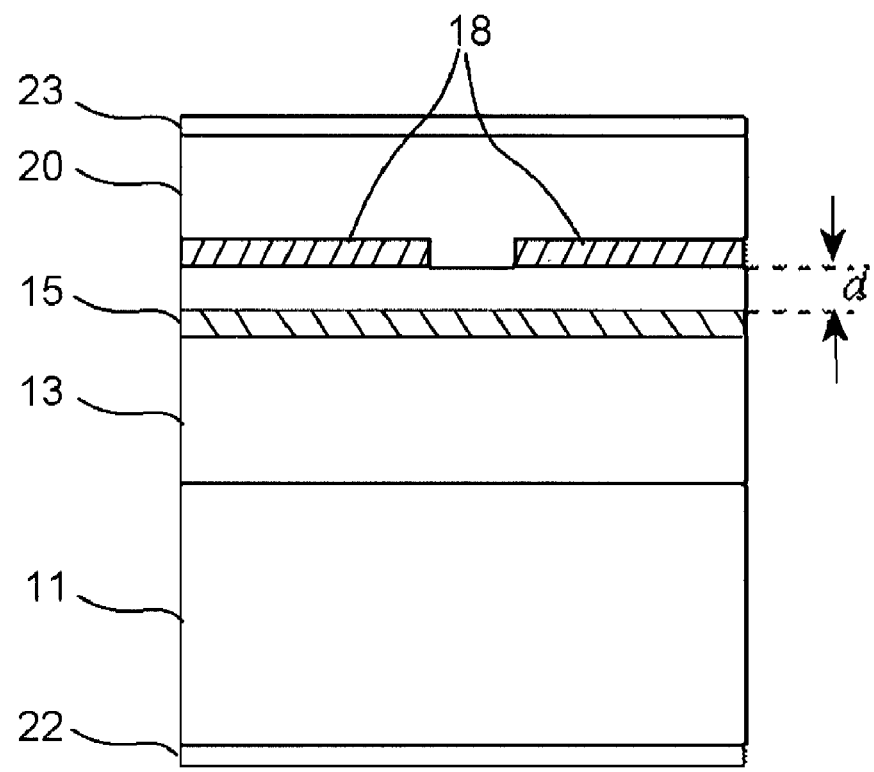
FIG. 5 is a schematic cross-sectional view of a nitride based semiconductor laser having a conventional inner stripe structure.

FIG. 3 is a cross-sectional view according to a third embodiment.

A different point from the first embodiment is that a p-type layer 109 which is a superlattice layer is formed not only in a striped aperture 108a of a current blocking layer 108 but also on a current blocking layer 108.

Growth of the p-type layer 109 above the current blocking layer 108 is accelerated by thinning the current blocking layer 108, for example. The third embodiment can also obtain the same effect as in the first embodiment.

In addition, the above mentioned embodiment is an exemplification, various modifications can be made, and a person skilled in the art will recognize that such modifications are also within the scope of the present invention. For example, an example of combining the second embodiment and the third embodiment can be made. Furthermore, for example, the p-type cladding layer 110 may be configured by a multiple-stage or a plurality of layers. Further, for example, an n-type cladding layer 103 may be configured by a superlattice structure.

As described above, although the embodiments according to the present invention are described with reference to the drawings, these are exemplications of the present invention and various configurations other than the above mentioned one can be employed.

For example, if it is a structure having the superlattice layer in the striped aperture of the current blocking layer, the current blocking layer can also be provided on an n side.

Furthermore, the current blocking layer may be discontinued at a portion other than the striped aperture and the end of the current blocking layer may not be conformed to the end of the device.

Further, for example, also in any of the first to the third embodiments according to the present invention, the p-type layer 109 which is of the superlattice structure may be configured by a superlattice structure containing InGaN and AlGaN, for example. In this case, particularly in the case of using GaN as the n-type substrate 101, an effect which compensates lattice strain can be obtained, as compared with the case that the p-type layer 109 of the superlattice structure is configured by the superlattice structure containing GaN and AlGaN. Therefore, degree of freedom in design for the layer thickness and composition of each layer which composes the superlattice structure increases and various characteristics can be improved with improvement of crystallinity.

Furthermore, for example, the p-type layer 109 which is the superlattice layer may change the composition and the layer thickness of each layer which composes the superlattice structure with respect to a layer thickness direction or a direction perpendicular to the layer thickness direction. In this case, particularly in the beginning stage of the second growth, a function that is like selective growth is generated depending on difference in crystallinity between the striped aperture and the current blocking layer. Therefore, it tends to increase Al composition at the striped aperture and there is a case that resistance of the aperture increases. In such a case, an effect which suppresses resistance deterioration at the striped aperture can be obtained by inclinedly changing the composition and the layer thickness which constitute the superlattice structure.

The invention claimed is:

1. A group III nitride compound semiconductor light-emitting device, comprising:
    an active layer;
    a current blocking layer which is formed on said active layer comprising an opening which forms a striped aperture;
    a superlattice layer, made of a group III nitride compound semiconductor including Al, which is solely formed in the opening of the current blocking layer;
    a cladding layer, made of a group III nitride compound semiconductor including Al, which is formed on said superlattice layer and said current blocking layer; and
    a contact layer formed on said cladding layer,
    wherein an average Al composition ratio of said superlattice layer is determined as x1 and an average Al composition ratio of said cladding layer is determined as x2, and
    wherein x1 and x2 meet the condition x1<x2.

2. The group III nitride compound semiconductor light-emitting device as set forth in claim 1,
    wherein said current blocking layer is equal to or less than 0.2 μm in layer thickness.

3. The group III nitride compound semiconductor light-emitting device as set forth in claim 2,
    wherein said current blocking layer is made of $Al_wGa_{1-w}N$ ($0.4 \leq w \leq 1$).

4. The group III nitride compound semiconductor light-emitting device as set forth in claim 1,
    wherein said superlattice layer comprises a plurality of layers; and
    wherein a composition of each of the plurality of layers and a layer thickness of each of the plurality of layers varies with respect to a layer thickness direction or a direction perpendicular to the layer thickness.

5. The group III nitride compound semiconductor light-emitting device as set forth in claim 1,
    wherein said superlattice layer comprises $In_yGa_{1-y}N$ ($0 \leq y \leq 1$) and $Al_zGa_{1-z}N$ ($0 < z \leq 1$).

6. The group III nitride compound semiconductor light-emitting device as set forth in claim 1,
    wherein a separation distance between said current blocking layer and said active layer is equal to or less than 0.2 μm.

7. A group III nitride compound semiconductor light-emitting device, comprising:
    an active layer;
    a current blocking layer which is formed on said active layer comprising an opening which forms a striped aperture;
    a superlattice layer, made of a group III nitride compound semiconductor including Al, which is formed on the current blocking layer and in the opening of the current blocking layer;
    a cladding layer, made of a group III nitride compound semiconductor including Al, which is formed on said superlattice layer; and
    a contact layer formed on said cladding layer,
    wherein an average Al composition ratio of said superlattice layer is determined as x1 and an average Al composition ratio of said cladding layer is determined as x2, and
    wherein x1 and x2 meet the condition x1<x2.

* * * * *